United States Patent
Chen et al.

(10) Patent No.: US 8,456,209 B2
(45) Date of Patent: Jun. 4, 2013

(54) DELAY LOCKED LOOP AND ASSOCIATED METHOD

(75) Inventors: Chun-Chia Chen, Hsinchu Hsien (TW);
Sterling Smith, Hsinchu Hsien (TW)

(73) Assignee: MStar Semiconductor, Inc. (TW)

( * ) Notice: Subject to any disclaimer, the term of this patent is extended or adjusted under 35 U.S.C. 154(b) by 240 days.

(21) Appl. No.: 12/956,138

(22) Filed: Nov. 30, 2010

(65) Prior Publication Data

US 2011/0128057 A1 Jun. 2, 2011

(30) Foreign Application Priority Data

Dec. 2, 2009 (TW) ................. 98141135 A

(51) Int. Cl.
*H03L 7/06* (2006.01)
(52) U.S. Cl.
USPC ..................... 327/158; 327/149; 327/161
(58) Field of Classification Search
USPC ................. 327/142, 147, 149, 158, 156, 161
See application file for complete search history.

(56) References Cited

U.S. PATENT DOCUMENTS

| | | | |
|---|---|---|---|
| 6,476,653 B1 | 11/2002 | Matsuzaki | |
| 6,809,555 B1 * | 10/2004 | Nguyen | 327/3 |
| 7,746,134 B1 * | 6/2010 | Lu et al. | 327/158 |
| 2009/0039930 A1 | 2/2009 | Kuroki et al. | |

FOREIGN PATENT DOCUMENTS

| | | |
|---|---|---|
| CN | 1664956 A | 9/2005 |
| CN | 1747327 A | 3/2006 |
| CN | 1893278 A | 1/2007 |

\* cited by examiner

*Primary Examiner* — Hai L Nguyen
(74) *Attorney, Agent, or Firm* — Han IP Law PLLC

(57) ABSTRACT

A delay locked loop includes a pulse generator, a delay unit, a phase detector and a control unit. The pulse generator generates a pulse signal and a determination signal according to an input clock signal. The delay unit delays the pulse signal according to a digital control signal to generate a delayed pulse signal. The phase detector detects a time delay of the delayed pulse signal according to the determination signal to generate a detection result. The control unit generates a digital control signal according to the detection result to control the delayed pulse signal by a delay amount.

14 Claims, 6 Drawing Sheets

DELAY LOCKED LOOP AND ASSOCIATED METHOD

CROSS REFERENCE TO RELATED PATENT APPLICATIONS

This patent application claims priority from Taiwan Patent Application No. 098141135, filed in the Taiwan Patent Office on Dec. 2, 2009, entitled "Delay Locked Loop and Associated Method", and incorporates the Taiwan patent application in its entirety by reference.

TECHNICAL FIELD

The present disclosure relates to a delay locked loop, and more particularly, to a delay locked loop of a storage circuit.

BACKGROUND OF THE PRESENT DISCLOSURE

Synchronous communication is currently applied to realize a high data transmission rate of a dynamic random access memory (DRAM); however, when the DRAM develops more advanced and higher-speed, e.g., a double data rate three synchronous dynamic random access memory (DDR3 SDRAM), a circuit implementing a phase locked loop (PLL) and an analog delay signal line to realize synchronous communication cannot meet requirements of a high data transmission rate DRAM due to fabrication limitations. In addition, a signal is transmitted between the PLL and the analog delay signal line via an analog signal form; however, since a voltage of an analog signal is easily affected by noises, errors of data access time points or signal levels of the DRAM occur—such a problem is especially serious for the high data transmission rate DRAM.

SUMMARY OF THE PRESENT DISCLOSURE

Therefore, one object of the present disclosure is to provide a digital delay locked loop for controlling a digital delay line to solve the foregoing problem.

According to an embodiment of the present disclosure, a delay locked loop comprises a pulse generator, a delay unit, a phase detector, and a control unit. The pulse generator generates a pulse signal and a determination signal according to an input clock signal. The delay unit coupled to the pulse generator delays the pulse signal according to a digital control signal to generate a delayed pulse signal. The phase detector coupled to the delay unit and the pulse generator detects a time delay of the delayed pulse signal according to the determination signal to generate a detection result. The control signal coupled to the phase detector and the delay unit generates the digital control signal according to the detection result to control the delayed pulse signal by a delay amount.

According to another embodiment of the present disclosure, a method applied to a delay locked loop comprises generating a pulse signal and a determination signal according to an input clock signal; delaying the pulse signal according to a digital control signal to generate a delayed pulse signal; detecting a time delay of the delayed pulse signal according to the determination signal to generate a detection result; and generating the digital control signal according to the detection result to control the delayed pulse signal by a delay amount.

In addition, the foregoing embodiment digital control signal may also be applied to control a delay amount of an input signal delayed (e.g., another pulse signal) by another delay unit without an additional control mechanism to reduce an overall circuit cost.

DETAILED DESCRIPTION OF THE PREFERRED EMBODIMENT

Figure 1:
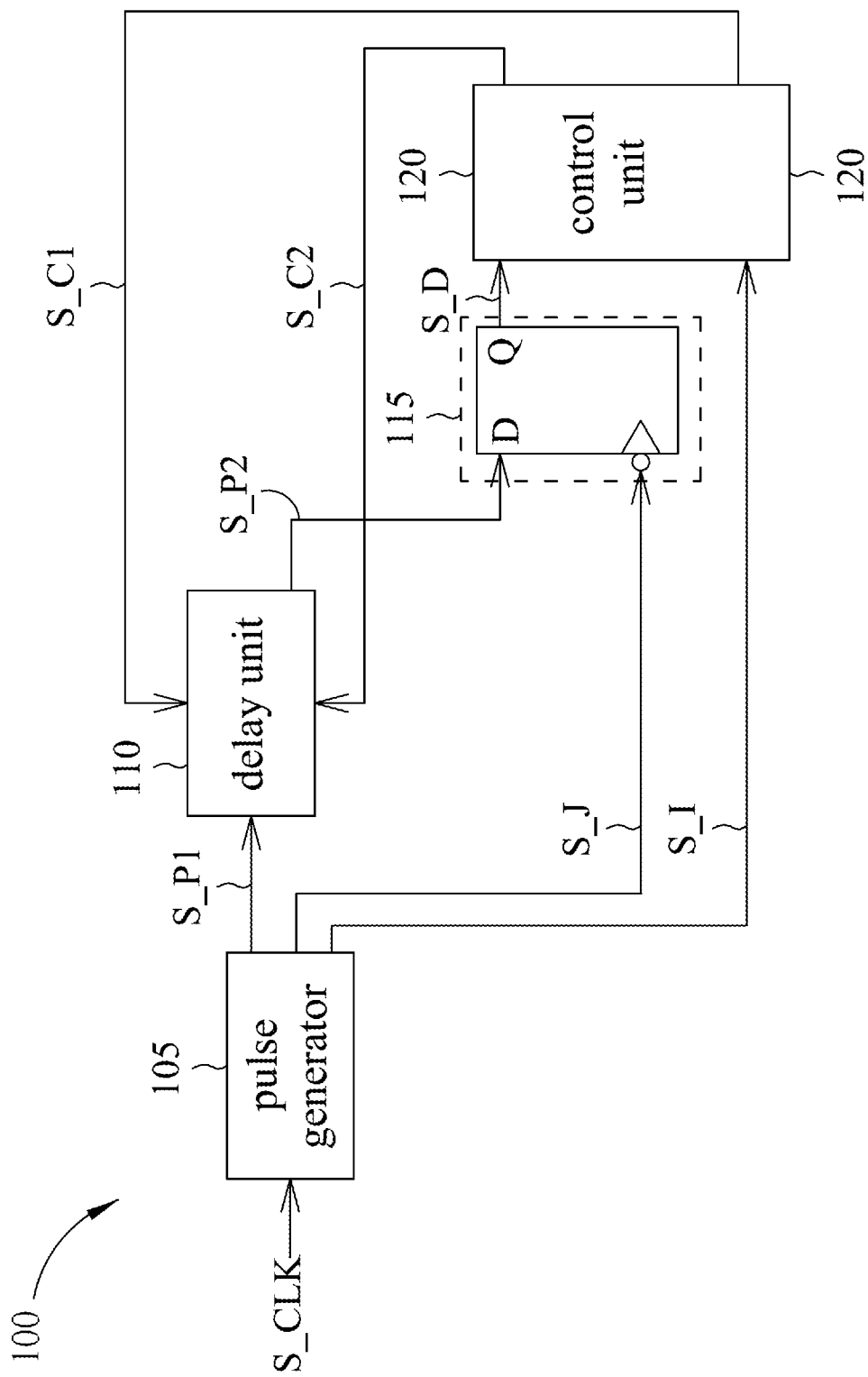
FIG. 1 is a schematic diagram of a delay locked loop in accordance with a first embodiment of the present disclosure.
Figure 2:
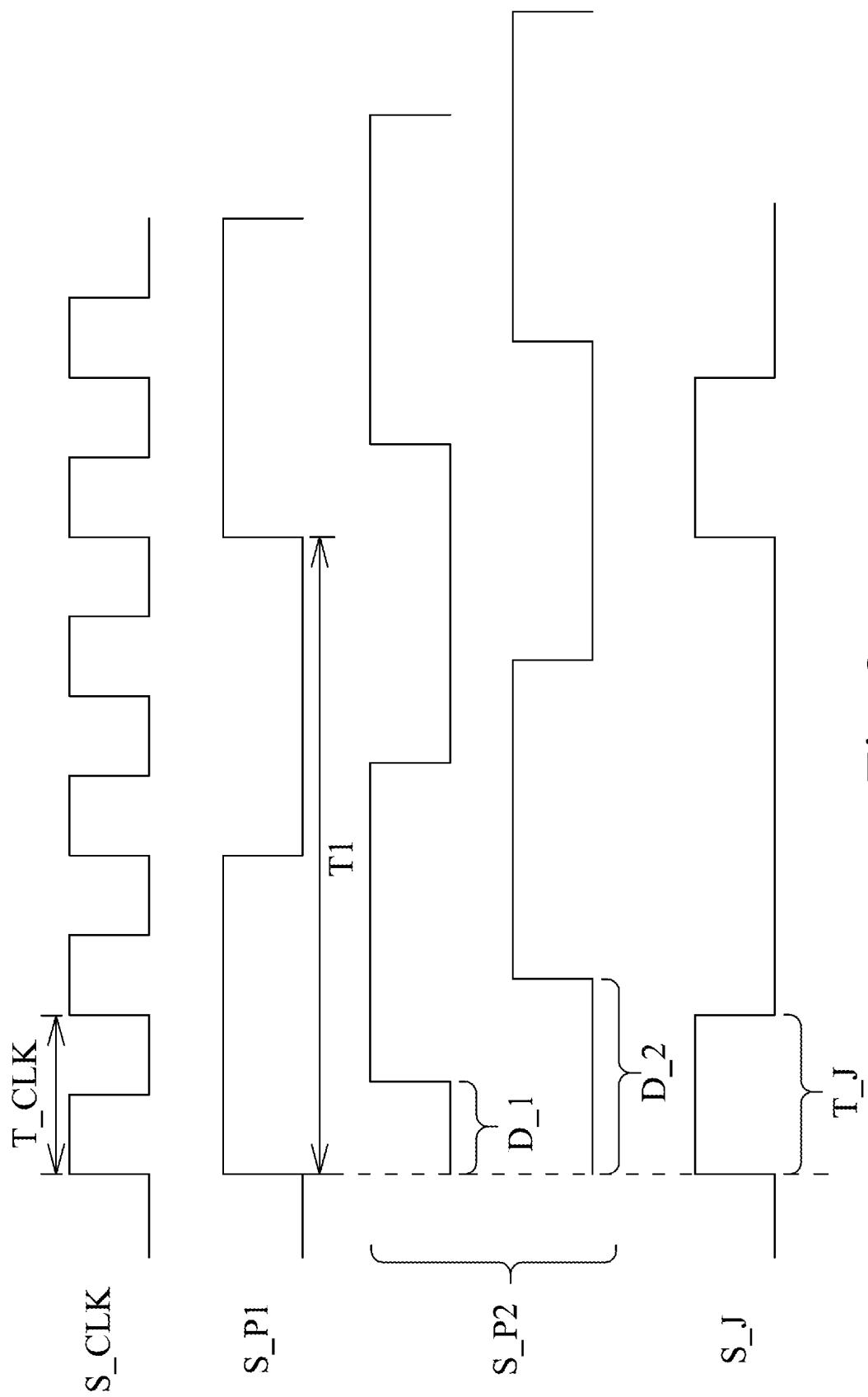
FIG. 2 is a schematic diagram of signal relationships contained in the delay locked loop in FIG. 1 in accordance with an embodiment of the present disclosure.

FIG. 1 shows a schematic diagram of a delay locked loop 100 in accordance with a first embodiment of the present disclosure, and FIG. 2 is a schematic diagram of signal relationships contained in the delay locked loop 100 in FIG. 1. The delay locked loop 100 comprises a pulse generator 105, a delay unit 110, a phase detector 115, and a control unit 120. The delay unit 110 can be realized by a digital controlled delay line (DCDL), and the phase detector 115 can be realized by a D-type flip-flop. The D-type flip-flop has a clock input end for receiving a determination signal S_J generated by the pulse generator 105, a data input end for receiving a delayed pulse signal S_P2 outputted by the delay unit 110, and a data output end for generating a detection result signal S_D to the control unit 120 according to the determination signal S_J and the delayed pulse signal S_P2. It is to be noted that, operations and functions of the phase detector 15 realized by the D-type flip-flop may also be realized by other different components.

The pulse generator 105 generates a predetermined pulse signal S_P1 to the delay unit 110 according an external input clock signal S_CLK, and generates the determination signal S_J to the phase detector 115. The delay unit 110 coupled the pulse generator 105 receives the predetermined pulse signal S_P1, and delays the predetermined pulse signal S_P1 according to a digital control signal S_C1 generated by the control unit 120 to generate the delayed pulse signal S_P2. The phase detector 115 coupled to the delay unit 110 and the pulse generator 105, receives the predetermined signal S_J generated by the pulse generator 105, and detects a time delay of the delayed pulse signal S_P2 according to the determination signal S_J to generate the detection result signal S_D. The control unit 120, coupled to the phase detector 115 and the delay unit 110, generates the digital control signal S_C1 according to the detection result signal S_D to adjust a delay amount of the predetermined pulse signal S_P1 delayed by the delay unit 110, so as to adjust the time delay of the delayed pulse signal S_P2. In addition, the pulse generator 105 generates an inform signal S_I to inform the control unit 120 to perform the determination, i.e., the pulse generator 105 controls the control unit 120 to determine a time point.

FIG. 2 shows signal relationships among the signals S_CLK, S_P1, S_P2 and S_J. In this embodiment, the predetermined pulse signal S_P1 generated by the pulse generator 105 is a square signal having a period T1 defined as four multiples of a period T_CLK of the input clock signal S_CLK. Due to variations of a signal voltage or temperature, the delayed pulse signal S_P2 outputted by the delay unit 110 in fact has different time delays, e.g., the delayed pulse signal S_P2 in FIG. 2 has different time delays D_1 and D_2. The phase detector 115 determines whether the different time delays (e.g., D_1 and D_2) are longer or shorter according to the determination signal S_J to determine whether to reduce or extend the time delays. For example, in this embodiment, when the pulse generator 105 generates the predetermined pulse signal S_P1, the determination signal S_J is simultaneously generated. Since a pulse width T_J of the determination signal S_J is a designed ideal time delay, when the actual time delay is longer than the pulse width T_J of the determination signal S_J, it means that the actual time delay needs to be reduced; otherwise, the actual time delay needs to be extended. Taking FIG. 2 as an example, when the time delay of the delayed pulse signal S_P2 is D_1, the determination signal S_J is phase inverted and is received (e.g., an inverter is disposed at the clock input end of the D-type flip-flop) by the D-type flip-flop of the phase detector 115 at the clock input end. Therefore, when the determination signal S_J is at a falling edge, the D-type flip-flop outputs a signal level of the delayed pulse signal S_P2 received at its data input end to its data output end, so as to generate the detection result signal S_D. Taking the actual time delay D_1 as an example, since the actual time delay is shorter, the signal level obtained by the D-type flip-flop is "1", and a signal logical level of the detection result signal S_D is "1". At this point, the control unit 120 properly controls the delay unit 110 to increase the delay amount of the predetermined signal S_P1 delayed by the delay unit 110 according to the signal logic level of the detection result signal S_D, so as to extend the actual time delay of the delayed pulse signal S_P2. In contrast, taking the actual time delay D_2 as an example, since the actual time delay is longer, the signal level received by the D-type flip-flop is "0", and the signal logical level of the detection result signal S_D is "0". At this point, the control unit 120 properly controls the delay unit 110 to reduce the delay amount of the predetermined pulse signal S_P1 according to the signal logical level of the detection result signal S_D, so as to reduce the actual time delay of the delayed pulse signal S_P2. Accordingly, by iterating the foregoing operations a plurality of times, the control unit 120 can adjust the actual time delay to approximate or equal the pulse width T_J (i.e., the designed ideal time delay) of the determination signal S_J.

It is to be noted that, the signal relationships contained in the delay locked loop 100 in FIG. 1 are designed as different forms, and are not limited to those shown in FIG. 2. For example, the period T1 of the predetermined pulse signal SP_1 may also be designed as twice, triple or other multiples of the period T_CLK of the input clock signal S_CLK, and the phase detector 115 is also realized by other circuits, such that the time point of generating the detection result signal may be other time points apart from the falling edge of the determination signal S_J. More specifically, the phase detector 115 may be realized by other circuits to generate the detection result signal S_D at a rising edge of the detection signal S_J. In other words, according to the embodiment of the present disclosure, early/late judgment of the time delay of the delayed pulse signal S_P2 is determined according to a transition of a pulse logical level of the determination signal S_J, and such a modification is within the scope of the present disclosure.

In addition, the control unit 120 controls the delay unit 110 via different logic algorithms, such that the final output digital control signal S_C1 corresponds to a preferred adjustment amount, e.g., a successive search algorithm or a binary search algorithm is implemented for search. In order to obtain better efficiency, in this embodiment, the control unit 120 implements the binary algorithm to fast obtain the digital controls signal S_C1 corresponding to the preferred adjustment amount. For example, supposing that the digital control signal S_C1 has ten bits and an initial value of the digital control signal S_C1 is defined as "1000000000", when the initial value is adopted to adjust the signal logic level of "0" of the detection result signal S_D due to the actual time delay (i.e., the actual time delay is long), the control unit 120 adjusts the control signal S_C1 to "0100000000" according to the signal logic level of "0" of the detection result signal S_D, and reduces the actual time delay according to the adjusted digital controls signal S_C1. In contrast, when the initial value of "1000000000" is adopted to adjust the actual time delay and create the signal logic level of "1" of the detection result signal S_D (i.e., the actual time delay is short), the control unit 120 adjusts the digital control signal S_C1 to "1100000000" according to the signal logic level of "1" of the detection result signal S_D, and extends the actual time delay according to the adjusted digital control signal S_C1. In other words, the control unit 120 every time adjusts from a most significant bit (MSB) to a second MSB to obtain the digital control signal S_C1, and until it is determined that the digital control signal S_C1 controls the actual time delay to approximate an ideal phase delay, the control unit 120 only ends the binary search algorithm and regards the final digital control signal S_C1 as the preferred control signal. Since the phase detector 115 determines the length of the actual time delay created by the digital control signal S_C1 via simple early/late judgment, and the control unit 120 obtains the preferred digital control signal S_C1 via the binary search algorithm, the delay locked loop 100 in this embodiment has high efficiency. It is to be noted that, variations of a temperature and a signal voltage may at any time cause changes of the actual time delay, and thus the control unit 120 outputs the digital control signal S_C1 that is accordingly changed to revise the current actual time delay when performing time delay control. In other words, a least significant bit (LSB) of the digital control signal S_C1 may switch between "0" and "1". In order to solve this problem, the control unit 120 iterates the binary search a plurality of times, averages a plurality of search results, and regards an average result as a digital code corresponding to the digital control signal S_C1. For improving efficiency and reducing calculation time of the algorithm, the control unit 120 may also omit the switch between "0" and "1" of the LSB, and directly regards a search result of a first time of binary search as the digital code corresponding to the digital control signal S_C1.

Figure 3:
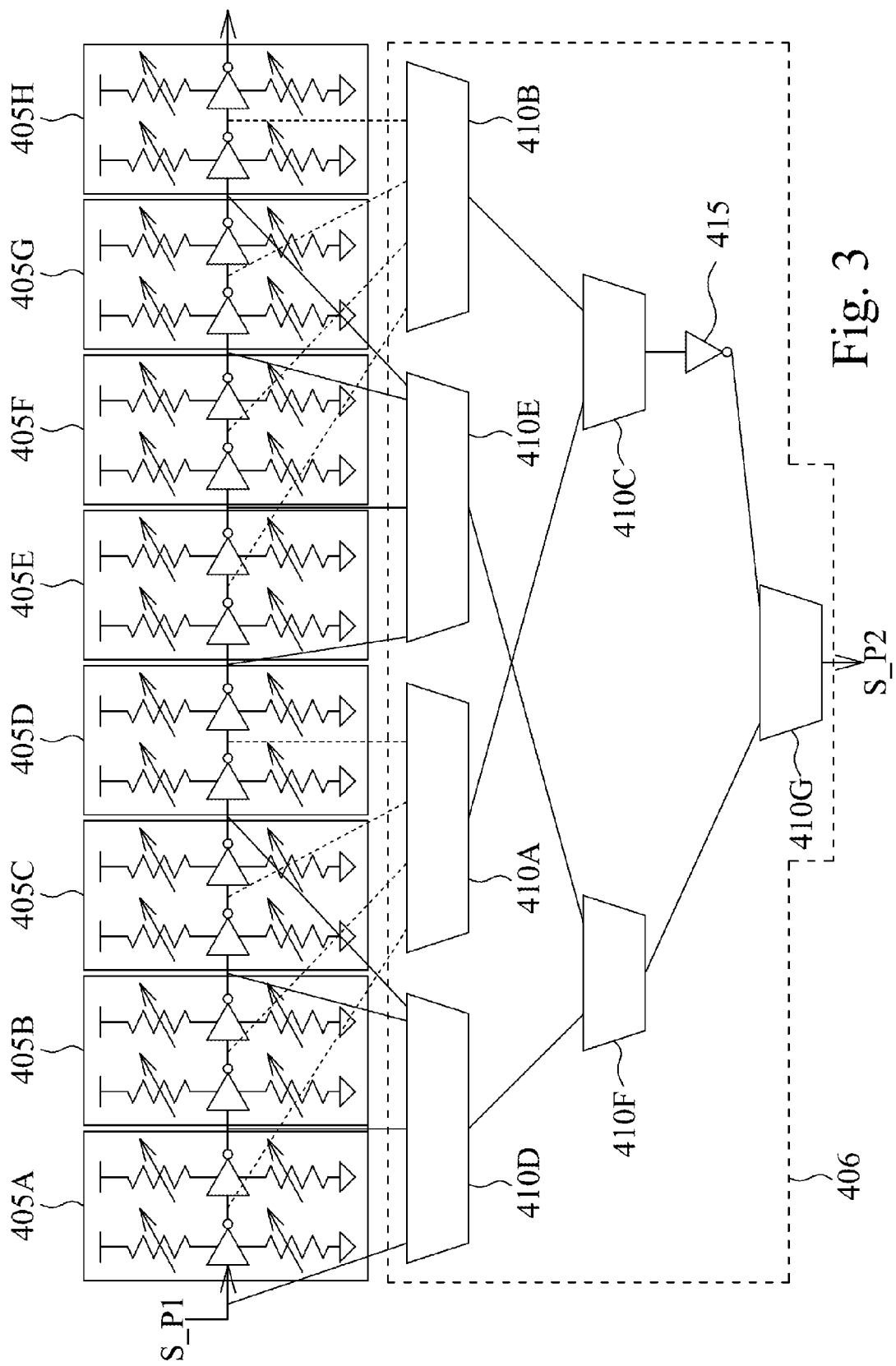
FIG. 3 is a schematic diagram of a delay unit of the delay locked loop in FIG. 1 in accordance with an embodiment of the present disclosure.

Further, the delay unit 110 can be designed as having a multi-phase selecting function, and selects a desired predetermined phase according to a phase selecting signal S_C2 outputted by the control unit 120. Refer to FIG. 3 showing a schematic diagram of a delay unit 110 in FIG. 1 in accordance with an embodiment of the present disclosure. The delay unit 110 comprises a plurality of phase delay circuits 405A to 405H and a phase selecting circuit 406. Each of the phase delay circuits 405A comprises a first inverter and a second inverter, and each of the inverter goes with at least one control resistor (e.g., in this embodiment, two resistors are disclosed for example). The digital control signal S_C1 generated by the control unit 120 is for controlling resistance value of the control resistor going with the each of the inverters to adjust a charge time for a supply voltage charging the control resistor and a capacitor, so as to achieve an effect of a trigger time delay of the inverter. The trigger time delay is a delay amount of the predetermined pulse signal S_P1 delayed by the delay unit 110. In addition, for operations and functions of the first inverter and the second inverter, e.g., the first inverter of the phase delay circuit 405A receives and phase inverts the predetermined pulse signal SP_1 inputted into the phase delay circuit 405A to generate an inverted signal. The second inverter again phase inverts the inverted signal generated by the first inverter, and generates a signal serving as an output signal of the phase delay circuit 405A that is outputted to a next phase delay circuit 405B. In other words, for the input signal and output signal of the phase delay circuit 405A, phases are not completely inverse to each other and have only a phase delay between them. The phase delay generated by the phase delay circuit 405A comprises respective time delays between receiving the signal and generating the inverted signal via the first inverter and the second inverter, respectively. Other phase delay circuits 405B to 405H and the respective first and second inverters have identical or similar operations and functions, and details thereof shall not be described for brevity.

Since each of the inverter provides a phase delay amount on the predetermined pulse signal S_P1, and output signals of different inverters are regarded as delayed predetermined pulse signals S_P2 having different phases, a predetermined phase needs to be properly selected to obtain the delayed predetermined pulse signal S_P2 having the predetermined phase, such that the phase selecting circuit 406 according to the present disclosure selects the predetermined phase from the plurality of phase delay amounts according to the phase selecting signal S_C2. In practical applications, the phase selecting circuit 406 comprises a plurality of multiplexers 410A to 410G and an inverter 415. The output signal of each first inverter is coupled to an input end of a first group of multiplexers 410A and 410B, and an output end of the first group is coupled to an input end of the multiplexer 410C having an output end coupled to an input end of the multiplexer 410G via the inverter 415, which has a function of removing signal inverse created by the first inverter. In addition, the output signal of each second inverter is coupled to an input end of a second group of multiplexers 410D and 410E, and an output end of the second group is coupled to an input end of the multiplexer 410F having an output end coupled to an input end of the multiplexer 410G. By properly controlling the multiplexers 410A to 410G via the phase selecting signal S_C2, a signal outputted by the output end of the multiplexer 410G is the delayed predetermined pulse signal S_P2 having the predetermined phase. For example, the delay locked loop 100 is phase delay locked according to the determination signal S_J and an output signal of the phase delay circuit 405H of the delay unit 110. When the delay locked loop 100 is locked, a phase delay amount of the output signal of the phase delay circuit 405H of the delay unit 110 is equal to the pulse width T_J of the determination signal S_J. At this point, each inverter of a phase delay circuit of the delay unit 16 creates a phase delay amount equal to 1/16 of the pulse width T_J. Therefore, when the output signal of the multiplexer 410G is an output signal of the first inverter of the phase delay circuit 405B, the predetermined phase is 3/16 of the pulse width T_J; when the output signal of the multiplexer 410G is an output signal of the first inverter of the phase delay circuit 405C, the predetermined phase is 5/16 of the pulse width T_J, and so on. In another embodiment, the delay locked loop 100 first controls the phase selecting circuit 406 via the phase selecting signal S_C2 to select one of the output signals generated by the phase delay circuits 405A to 405H, and then is phase delay locked according to the selected output signal and the determination signal S_J. Therefore, when the delay locked loop 100 is phase locked, a phase delay amount of the selected output signal equals the pulse width T_J of the determination signal S_J.

Figure 4:
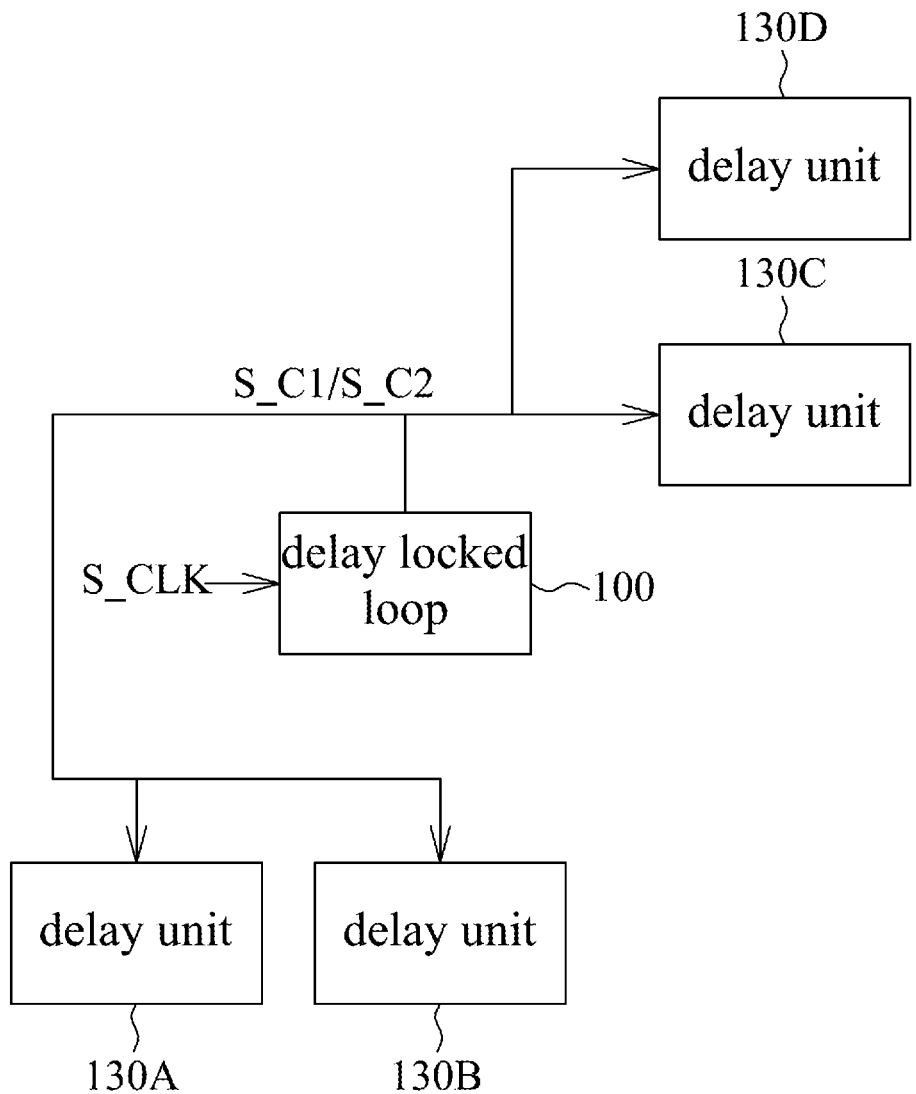
FIG. 4 is a schematic diagram of the delay locked loop in FIG. 1 applied to a high data transmission rate DRAM.

In addition, the control unit 120 according to the present disclosure generates the digital control signal S_C1 according to the detection result to control another delay unit. FIG. 4 shows a schematic diagram of a delay locked loop 100 in FIG. 1 applied to a high speed transmission rate DRAM, e.g., a double data rate DRAM (DDR DRAM) or other memories having high data access rates. The high transmission data rate DRAM comprises a plurality of digital control delay lines. For convenience, FIG. 4 only shows four digital control delay lines, and the present disclosure is to output the digital control signals S_C1 and S_C2 generated by the control unit 120 in FIG. 1 to other digital control delay lines, so as to properly control a time delay created by other digital control delay lines and to select a proper phase. Since in a circuit structure of the high transmission data rate DRAM, the control signals S_C1 and S_C2 are transmitted between a control end (i.e., the delay locked loop 100) and a controlled end (i.e., other delay lines) by digital signals, compared to the conventional transmission using the analog signals, the circuit structure in FIG. 3 is capable of reducing or avoiding errors created by noises. In addition, for that all of the digital control delay lines of the high transmission data rate DRAM theoretically have identical or similar characteristics, i.e., the actual time delay amounts created by the digital control delay lines theoretically have variations of an identical trend due to variations of the temperature or the signal voltage, according to the present disclosure, a time delay control result of a single digital control delay line is implemented to control other digital control delay lines to reduce the number of all control circuits.

Figure 5:
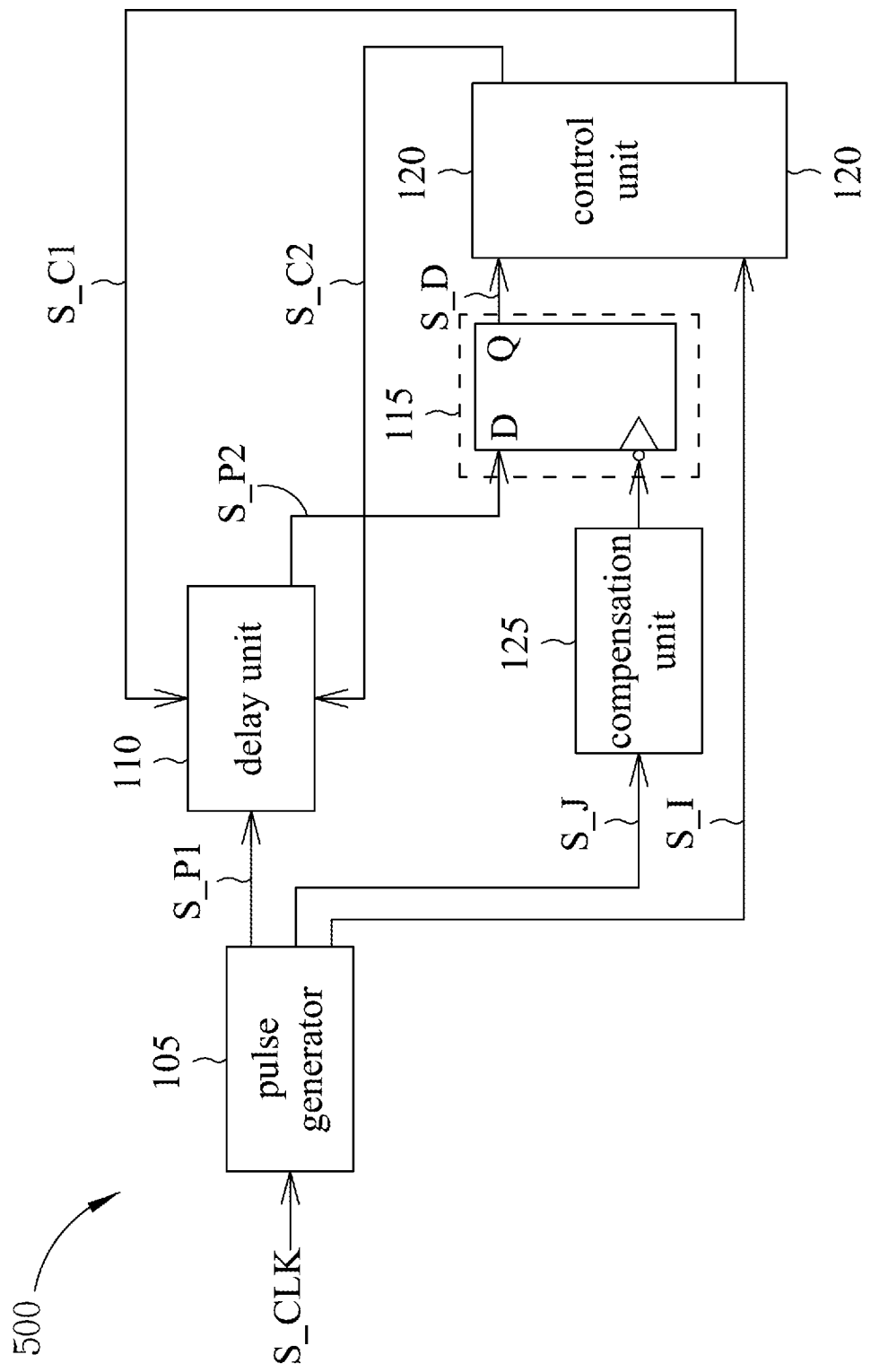
FIG. 5 is a schematic diagram of a delay locked loop in accordance with a second embodiment of the present disclosure.

Further, since the delay unit 110 is designed as having a multi-phase selecting function, a phase compensating unit can be added to prompt the phase detector 115 to determine more accurately in other embodiments. FIG. 5 shows a schematic diagram of a delay locked loop 500 in accordance with a second embodiment of the present disclosure. On top of the pulse generator 105, the delay unit 110, the phase detector 115 and the control unit 120, the delay locked loop 500 further comprises a compensation unit 125, which is coupled between the pulse generator 105 and the phase detector 115 and compensates the phase of the determination signal S_J generated by the pulse generator 105. For example, the delay unit 110 provides a predetermined phase to a predetermined pulse signal S_P1 to generate a delayed pulse signal S_P2 having the predetermined phase, and the compensation unit 125 provides a phase to the determination signal S_J. The phase provided by the compensation unit 125 is directly proportional to the predetermined phase provided by the delay unit 110. Accordingly, the phase provided by the compensation unit 125 becomes larger as the predetermined phase gets larger. Therefore, phase compensation is effectively performed to achieve an object of reducing a phase difference between the determination signal S_J and the delayed pulse signal S_P2, so as to increase determination accuracy of the subsequent phase detector 115. In addition, when the phase provided by the compensation unit 125 is identical to the predetermined phase provided by the delay unit 110, the provided phase is adopted for phase compensation to remove the phase difference between the foregoing two signals. Further, operations of the compensation unit 125 may be controlled by the control unit 120 to adjust the provided phase.

Figure 6:
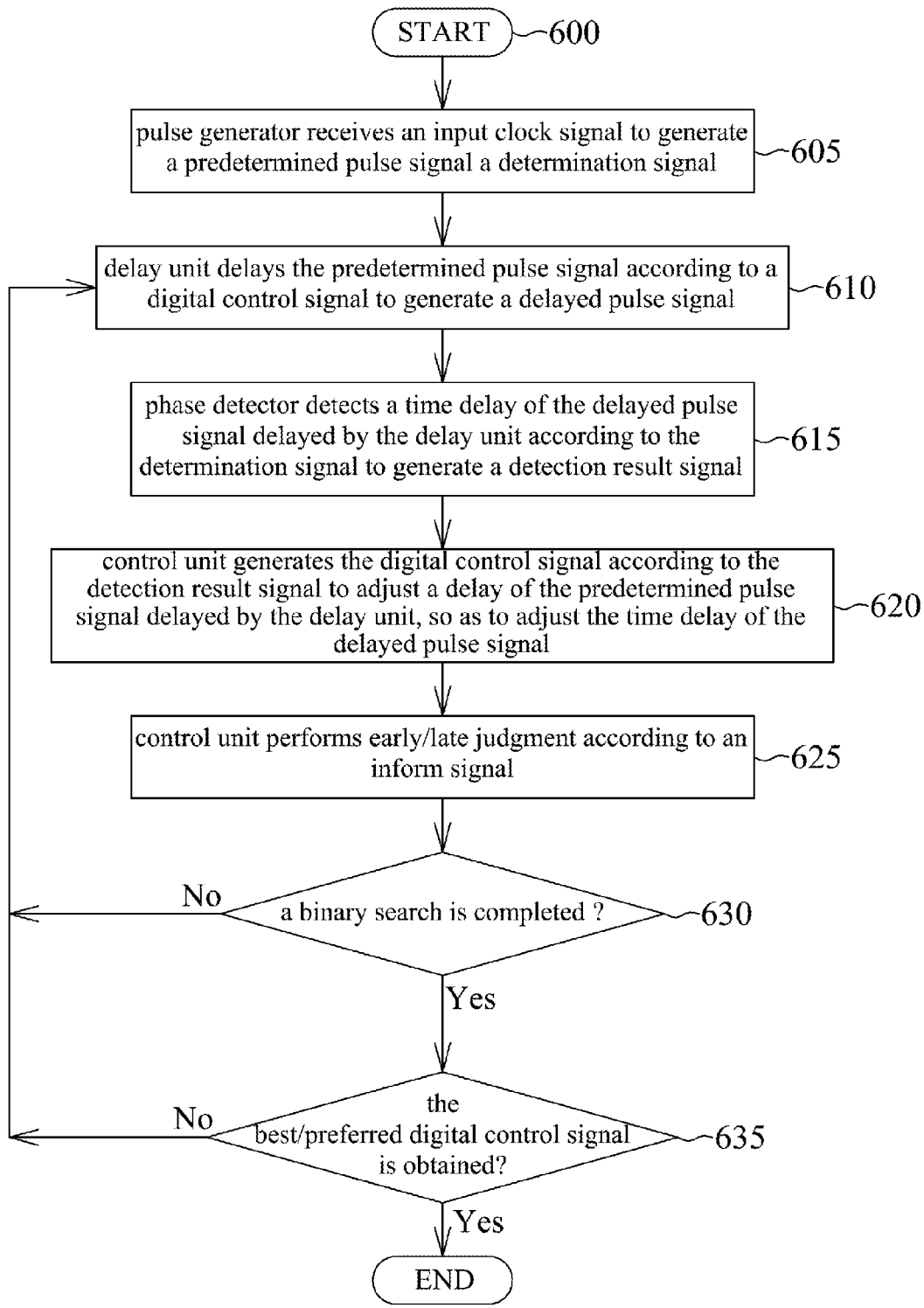
FIG. 6 is a flow chart of operations of a delay locked loop in FIG. 1.

FIG. 6 shows a flow chart of operations of the delay locked loop in FIG. 1. The steps in the flow chart need not be executed as the sequence shown in FIG. 6 nor be successive, provided that the same result is substantially achieved; that is to say, the steps in FIG. 6 can be interleaved with other steps. Details of the flow are described below.

The flow begins with Step 600. In Step 605, the pulse generator 105 receives an input clock signal S_CLK to generate a predetermined pulse signal S_P1 to the delay unit 110, and generates a determination signal S_J. In Step 610, the delay unit 110 delays the predetermined pulse signal S_P1 according to a digital control signal S_C1 generated by the control unit 120 to generate a delayed pulse signal S_P2. In Step 615, the phase detector 115 detects a time delay of the delayed pulse signal S_P2 delayed by the delay unit 110 according to the determination signal S_J to generate a detection result signal S_D. In Step 620, the control unit 120 generates the digital control signal S_C1 according to the detection result signal S_D to adjust a delay of the predetermined pulse signal S_P1 delayed by the delay unit 110, so as to adjust the time delay of the delayed pulse signal S_P2. In Step 625, the control unit 120 performs early/late judgment according to an inform signal S_I. In Step 630, it is determined whether a binary search is completed. In Step 635, it is determined whether the best/preferred digital control signal S_C1 is obtained. The flow ends in Step 640.

While the present disclosure has been described in terms of what is presently considered to be the most practical and preferred embodiments, it is to be understood that the present disclosure needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. A delay locked loop, comprising:
    a pulse generator that generates a pulse signal and a determination signal according to an input clock signal;
    a delay unit that delays the pulse signal according to a digital control signal to generate a delayed pulse signal;
    a phase detector that detects a time delay of the delayed pulse signal according to the determination signal to generate a detection result; and
    a control unit that generates the digital control signal according to the detection result to control the delayed pulse signal by a delay amount,
    wherein the phase detector performs early/late judgment on the delayed pulse signal according to a pulse width of the determination signal to generate the detection result.

2. The delay locked loop as recited in claim 1, wherein the pulse generator further generates an inform signal, and the control unit generates the digital control signal according to the detection result upon receiving the inform signal.

3. The delay locked loop as recited in claim 1, wherein the delay unit comprises:
    a plurality of phase delay circuits, each providing a respective phase delay amount to the pulse signal according to the digital control signal; and
    a phase selecting circuit that selects the predetermined phase from a plurality of phase delay amounts generated by the phase delay circuits to output the delayed pulse signal having the predetermined phase.

4. The delay locked loop as recited in claim 1, wherein the phase detector performs the early/late judgment on the time delay of the delayed pulse signal at a transition of a pulse logic level of the determination signal.

5. The delay locked loop as recited in claim 1, wherein the control unit generates the digital control signal according to the detection result and a binary search algorithm.

6. The delay locked loop as recited in claim 1, wherein the digital control signal generated by the control unit controls another delay unit.

7. The delay locked loop as recited in claim 1, wherein the delay unit further provides a predetermined phase to the pulse signal, and the delay locked loop further comprises:
    a compensation unit, coupled between the pulse generator and the phase detector, that provides a phase amount to the determination signal for phase compensation, with the provided phase amount being directly proportional to the predetermined phase.

8. The delay locked loop as recited in claim 7, wherein the phase amount provided by the compensation unit is identical to the predetermined phase provided by the delay unit.

9. A method of operating a delay locked loop, comprising:
    generating a pulse signal and a determination signal according to an input clock;
    delaying the pulse signal according to a digital control signal to generate a delayed pulse signal;
    detecting a time delay of the delayed pulse signal according to the determination signal to generate a detection result; and
    generating the digital control signal according to the detection result to control the delayed pulse signal by a delay amount,
    wherein generating the detection result comprises performing early/late judgment on the time delay of the delayed pulse signal according to a pulse width of the determination signal to generate the detection result.

10. The method as recited in claim 9, wherein generating the digital control signal according to the detection result is performed when an inform signal is received.

11. The method as recited in claim 9, wherein performing the early/late judgment on the time delay of the delayed pulse signal is performed at a transition of a pulse logic level of the determination signal.

12. The method as recited in claim 9, wherein generating the digital control signal comprises:
    generating the digital control signal according to the detection result and a binary search algorithm.

13. The method as recited in claim 9, further comprising:
    providing a predetermined phase to the pulse signal; and
    providing a phase amount to the determination signal for phase compensation before the step of detecting the time delay of the delayed pulse signal according to the determination signal is performed;
    wherein, the phase amount provided to the determination signal is directly proportional to the predetermined phase.

14. The method as recited in claim 13, wherein the phase amount provided to the determination signal is identical to the predetermined phase.

* * * * *